United States Patent
Marion

(10) Patent No.: US 7,524,704 B2
(45) Date of Patent: Apr. 28, 2009

(54) METHOD FOR ENCAPSULATING A COMPONENT, ESPECIALLY AN ELECTRIC OR ELECTRONIC COMPONENT, BY MEANS OF AN IMPROVED SOLDER SEAM

(75) Inventor: François Marion, Saint Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 270 days.

(21) Appl. No.: 11/503,847

(22) Filed: Aug. 14, 2006

(65) Prior Publication Data

US 2007/0048905 A1 Mar. 1, 2007

(30) Foreign Application Priority Data

Aug. 30, 2005 (FR) .................................. 05 52610

(51) Int. Cl.
*H01L 21/00* (2006.01)
(52) U.S. Cl. ..................... 438/126; 438/119; 438/127
(58) Field of Classification Search ................ 438/119, 438/121, 124, 125, 126, 127
See application file for complete search history.

(56) References Cited

U.S. PATENT DOCUMENTS

| | | | | |
|---|---|---|---|---|
| 5,243,145 A | * | 9/1993 | Mather | ........................ 174/557 |
| 5,804,870 A | * | 9/1998 | Burns | ........................ 257/666 |
| 6,238,951 B1 | * | 5/2001 | Caillat | ........................ 438/108 |
| 6,566,170 B1 | | 5/2003 | Marion et al. | |
| 2006/0022319 A1 | * | 2/2006 | Matsuzawa et al. | ......... 257/678 |
| 2006/0076651 A1 | * | 4/2006 | Tsutsue | ...................... 257/620 |
| 2006/0180909 A1 | * | 8/2006 | Kim | ........................... 257/680 |

FOREIGN PATENT DOCUMENTS

| EP | 1 557 394 A1 | 7/2005 |
|---|---|---|
| FR | 2 780 200 A1 | 12/1999 |

* cited by examiner

*Primary Examiner*—M. Wilczewski
*Assistant Examiner*—Seth Barnes
(74) *Attorney, Agent, or Firm*—Burr & Brown

(57) ABSTRACT

A method for encapsulating a component by using a chamber in which there is a vacuum or controlled atmosphere, positioning a continuous sealing seam made of a metal or a metal alloy on a wettable surface previously placed on a substrate including at least one component and extending around the periphery of the component(s), positioning a package on the sealing seam, and raising the temperature inside the chamber to fuse the material that constitutes the sealing seam, thereby causing the package to drop onto the substrate and form a leaktight, hermetic seal between the package and the substrate.

8 Claims, 4 Drawing Sheets

Appendix C

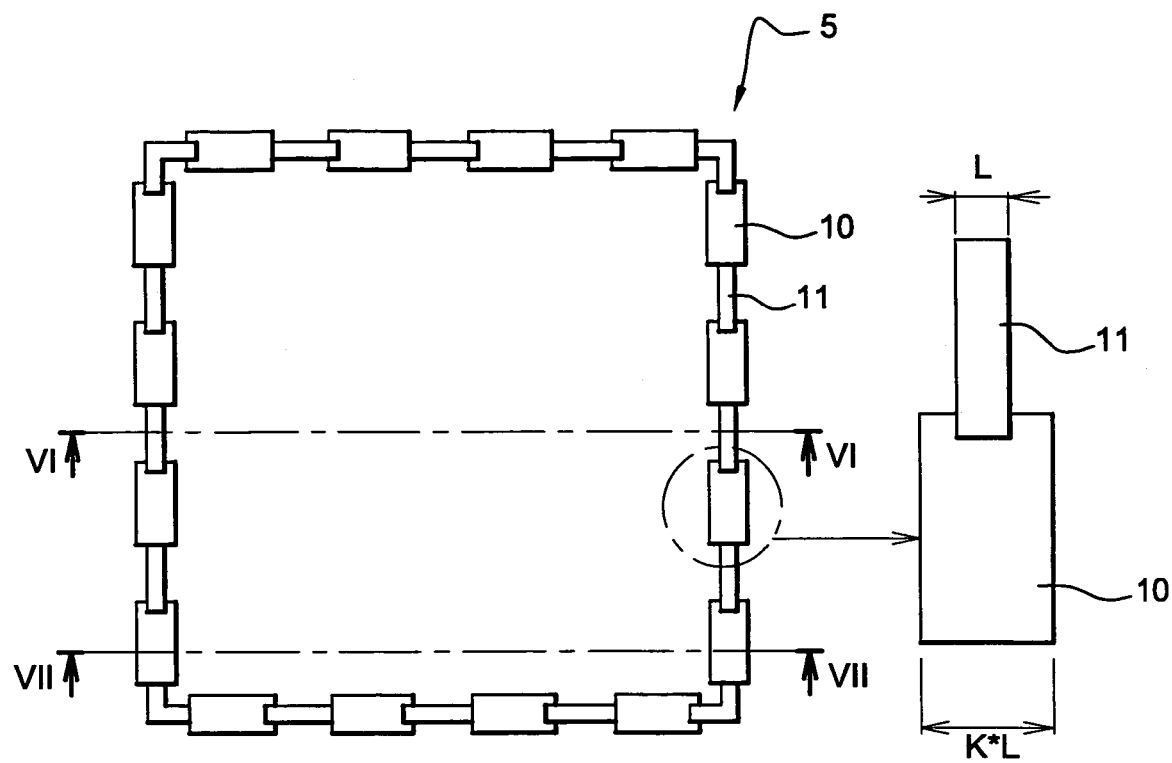
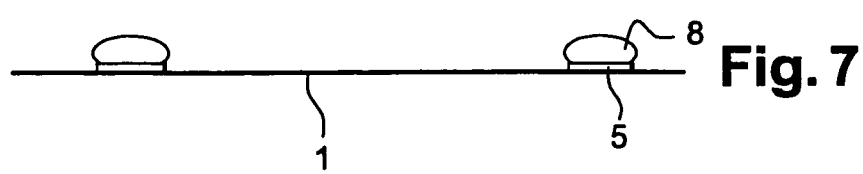

METHOD FOR ENCAPSULATING A COMPONENT, ESPECIALLY AN ELECTRIC OR ELECTRONIC COMPONENT, BY MEANS OF AN IMPROVED SOLDER SEAM

BACKGROUND OF THE INVENTION

The invention relates to the field of microelectronics, more especially to encapsulation, especially leaktight and hermetic encapsulation of components, especially electric or electronic components.

It relates in particular to the field of microcomponents, more classically referred to as chips but also to microsensors and microactuators, such as micro-electro-mechanical systems (MEMS), etc.

DESCRIPTION OF THE PRIOR ART

The microcomponents in question dealt with in the present invention are conventionally deposited on a substrate of an appropriate nature, for example a semiconductor type substrate (monocrystalline silicon, sapphire, etc.) for electronic components.

These substrates have conductors that radiate from the microcomponent towards the periphery of the substrate in order to make it possible, above all, to process and analyse the signals that said component is expected to generate or to control the functions that it incorporates, besides making it possible to provide the required electrical power supply for the component, if applicable.

In certain cases these components are encapsulated inside a package or protective cover or equivalent type structure, thus making it possible to ensure protection again shock, corrosion, stray electromagnetic radiation, etc.

This cover or package may also include a window that is transparent to the radiation to be detected by said component or may include one or more lenses to concentrate said radiation in the component.

Some of these microcomponents need to operate in a vacuum or in a controlled atmosphere (pressure, inert gas, etc.) or need to be sealed against the ambient atmosphere in order to work properly. Because of this, the above-mentioned package or cover is utilized in order to define a cavity above said component that confines the controlled atmosphere or a more or less partial vacuum.

In the particular context of these encapsulated microcomponents, various technical problems are encountered during their production.

Firstly, there is the crucial issue of the quality of hermetic sealing of the connection between the cover or package and the component in order to ensure effective isolation of said component from external influences regardless of the nature of the atmosphere that is confined within the defined space.

There is also a need to be able to control the nature of the atmosphere confined in said space. This atmosphere must therefore be created in the space prior to sealing and, generally speaking, prior to fixing the cover on the component.

Various techniques have been used in order to achieve such encapsulation of an electric or electronic component.

These include the wafer-on-wafer stacking principle, wafer being the specialist term used to describe a semi-conductor substrate. This involves topping the wafer that contains the electric or electronic component(s) with another wafer in which one or more cavities capable of defining the space to be confined have been made.

Fixing is achieved through soldering, especially anodic soldering, by fusion or by sintered glass bonding. Although the principle used is satisfactory in terms of leaktightness, it does nevertheless pose several difficulties in terms of connector technology. In fact, accessing the bonding pads in order to solder the connector wires is complicated and the topologies that can be used are therefore limited. Moreover, because a high soldering temperature is generally required, this limits the number of electronic components that can be implemented inside the spaces defined fairly drastically.

Another alternative involves producing covers by depositing thin-film layers. A cavity for an active component is formed on a wafer and then closed off by using thin-film sealing techniques. For instance, a layer is grown by Low Pressure Chemical Vapour Deposition (LPCVD) or the cavity is simply covered.

The size of the cover may be reduced to the size of the active component. Although use of this technique is complex, it nevertheless has the advantage of being capable of simultaneously sealing numerous wafers comprising extremely small active components.

Finally, another technique involves soldering a cover or package on a wafer by using either chip covers, i.e. each active component is given a cover, or by using a larger chip that is capable of covering several active components on a single wafer.

This technique is classically performed in several stages: it consists in aligning the cover(s) above the components, all inside a chamber capable of ensuring a controlled atmosphere or in a vacuum chamber and then sealing the cover(s) on the component(s) employing technologies familiar to those skilled in the art, using, in particular, a soldered joint made of, for example, indium or a tin-lead alloy.

It is readily apparent that if a large number of operations of this type have to be performed or if a multi-component substrate is used, the installation needed to perform these operations becomes extremely onerous given the fact that all these operations must be carried out within the chamber which ensures that, as stated, a controlled atmosphere or a vacuum is maintained. In addition, such an operation is also extremely time-consuming if there is a plurality of covers, for a process that involves N cover fitting operations, the total operation time is:

N×(time to obtain controlled atmosphere or vacuum+
time to align cover on components+soldering
time)

This being so, the cost involved is considerable.

In order to optimize this duration, a solution has been proposed in document FR 2,780,200 which illustrates the use of an encapsulated electric component in one of its embodiments. The particular embodiment described is shown in FIGS. 1 to 3.

Conventional techniques are used to mount an electronic component 3 on a wafer 1 made of silicon for example. On the upper surface 4 of wafer 1 and around the periphery of the electronic component 3 there is a wettable surface or area 5 intended to accommodate a solder seam made of indium or a tin-lead alloy.

This document also mentions the presence of a wedge consisting of bumps 7 that are also made of a thermofusible material, advantageously identical to that which constitutes solder seam 8 and on which a cover 2 capable of defining, together with wafer 1 and solder seam 8, the desired cavity 9 containing the controlled atmosphere or vacuum rests.

In order to provide, within said cavity 9, the desired atmosphere, bumps 7 that define the wedge that supports cover 2 are located outside the solder seam, this assembly being placed inside a chamber within which there is the desired controlled atmosphere or vacuum. Simply raising the temperature sufficiently to melt the material that constitutes bumps 7 and solder seam 8 causes cover 2 to drop until it comes into contact with said solder seam in order to ensure leaktight closure of the cavity thus defined.

In practice, bumps 7 are also positioned on a wettable surface 6. Similarly, in order to improve contact and, above all, leaktightness, the lower surface of cover 2 also has wettable surfaces 5' and 6' respectively.

This being so, using such technology makes it possible to save considerable time compared with the process previously described, because the duration of a process involving N cover fitting operations, i.e. fitting covers in order to encapsulate N active components, then only equals:

N×time to align cover+1×time to obtain atmosphere+ 1×soldering time.

The time saved Δt therefore equals:

Δt=(N−1)×(time to obtain atmosphere+soldering time)

This decrease in the encapsulation time is highly significant because the time to obtain a controlled atmosphere or vacuum far exceeds the time needed to deposit the cover.

Although the technical solution suggested in the document is very attractive at a theoretical level, practical experience nevertheless shows that it is almost impossible to produce a leaktight or uniform solder seam prior to hermetic closure by remelting.

In fact, it has been demonstrated that the seam of fusible material, especially an alloy, does not form uniformly on the tape that constitutes the underlying wettable surface or area produced on the substrate using the Under Bump Metallisation (UBM) technique. In fact, because of well-known surface tension phenomena that tend to minimize the surface area that defines a given envelope, the tape tends to form clumps of solder in certain areas and leave areas where there is no material in others.

In fact, at the melting temperature of the alloy that constitutes the solder seam, the overall volume of the solder that is present represents a minimal external surface area equivalent to that of a bump rather than that of the linear seam desired.

SUMMARY OF THE INVENTION

The object of the present invention is precisely to overcome this drawback and suggest a technical solution that makes it possible to give the solder seam a certain degree of continuity capable of enhancing the desired lealctightness of the cavity defined by the encapsulation package.

This method for encapsulating a component, especially al electric or electronic component, involves, according to the invention:

firstly using a chamber in which there is a vacuum or controlled atmosphere;

then positioning a continuous sealing seam made of a metal or a metal alloy that advantageously has a low melting temperature on a wettable surface previously placed on a substrate comprising at least one component and extending around the periphery of the active component(s), positioning a package or cover of appropriate dimensions on the sealing seam;

and finally raising the temperature inside said chamber in order to achieve fusion of the material that constitutes the sealing seam, thereby causing firstly the cover or package to drop onto the substrate and consequently and secondly leaktight, hermetic sealing of the cover or package on said substrate capable of providing leaktight isolation of the internal cavity thus defined from the external atmosphere.

According to the invention, the wettable surface placed on the substrate around the periphery of the component(s) and on which the sealing seam is positioned has variations in one direction of the plane on which it is bounded other than in the direction parallel to the main direction in which the sealing seam extends.

In other words, in contrast to the prior art, the invention does not involve mounting a uniform wettable surface or area on the upper surface of the substrate, i.e. an area having a constant width, but giving this wettable surface or area a certain number of variations, especially variations in its width.

This being so, it has been demonstrated that selecting such a wettable surface diminished the surface tension phenomena that affect the continuity of the seam when the latter fuses, thus making it possible to give the said seam the sought after continuity and consequently give the assembly consisting of the substrate and its cover the desired leaktightness and hermetic seal.

According to one advantageous aspect of the invention, the variations in the dimension in question are periodic. In other words, the wettable surface has a repetitive pattern of the same dimensions along its entire length or main dimension.

According to another aspect of the invention, the wettable surface consists of a succession of rectangles with the width of two consecutive rectangles varying discreetly between two predetermined values.

In one alternative version, the wettable surface consists of a succession of discs with the diameter of two consecutive discs varying discreetly between two predetermined values.

In another alternative version, the wettable surface consists of a succession of squares or rhombi, one of the diagonals of which is oriented in the direction in which the seam extends, the other diagonal of two consecutive squares or rhombi varying discreetly between two predetermined values.

According to one particular aspect of invention, if L is the width of the constriction, i.e. the width of the pattern between two patterns that corresponds to the nominal width of the wettable surface, the width of said main pattern is equivalent to at least the value K*L where I<is a constant strictly in excess of 1.1 in order to achieve the desired result.

BRIEF DESCRIPTION OF THE DRAWINGS

The way in which the invention is implemented and its resulting advantages will be made more readily understandable by the descriptions of the following embodiments, given merely by way of example, reference being made to the accompanying drawings.

FIG. 4 is a schematic top view of the wettable surface in accordance with a first embodiment of the invention, FIG. 5 is a detailed view of one of the patterns thereof and FIGS. 6 and 7 are cross sections along lines VI-VI and VII-VII in FIG. 4 respectively.

DETAILED DESCRIPTION OF THE INVENTION

Figure 1:
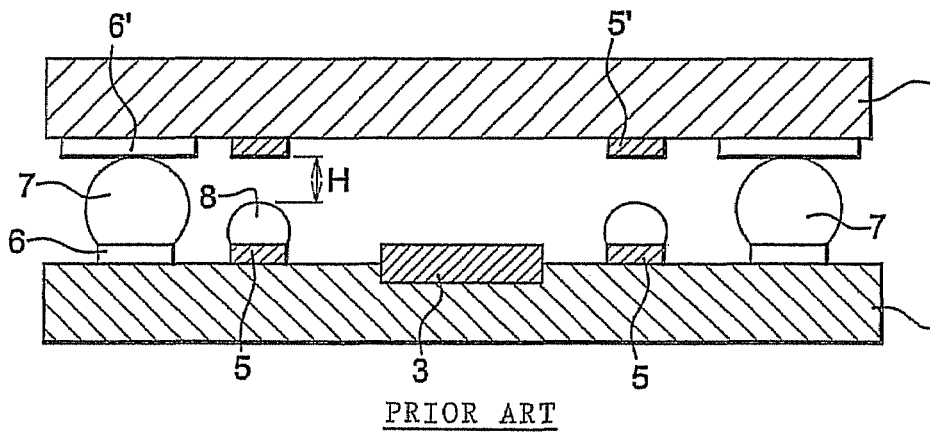
FIGS. 1, 2 and 3 show the prior art, FIGS. 1 and 3 showing schematic cross-sectional views of a substrate and a cover prior to and after the increase in temperature, respectively, that causes remelting of the sealing seam, FIG. 2 being a schematic view of the upper surface of the substrate.
Figure 2:
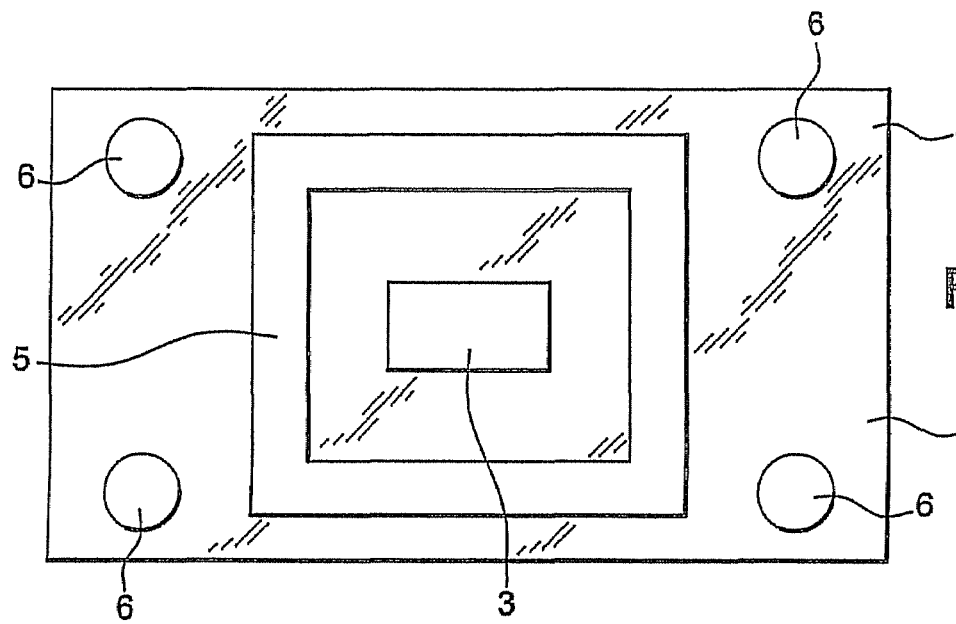
Figure 3:
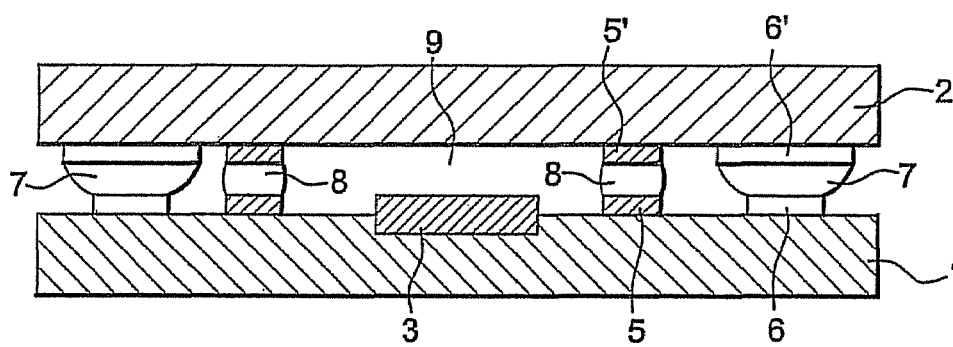

As already indicated in the preamble to this description, component 3 that is to be encapsulated consists of an MEMS, an optical component, a microsensor, especially for detecting radiation (for instance a bolometer), but also an accelerometer, an actuator or a microactuator, etc. This active component 3 is mounted on a substrate 1, typically consisting of a substrate made of silicon for example or, generally speaking, any traditional material used to assemble microcomponents.

Conventionally, any electrical signals that may be required to drive the component are routed to the latter via conductors that are also placed on said substrate in the direction of the periphery of the component. Such conductors are also used to allow transfer of the signals generated by said component or, conversely, those that control the component if the latter consists of an actuator.

Without extending beyond the general scope of the invention, the component must be protected against external influences or may require a controlled atmosphere to operate correctly, for instance specific pressures, or even the presence of an inert gas or a specific gas or may even need to operate in a vacuum, as in the case of cooled components.

To achieve this, a cover or package 2 is hermetically sealed on substrate 1 so as to define a cavity 9 that is isolated from the external environment and active component 3 is located inside this cavity. This package or cover is sealed by means of a solder or sealing seam 8 by using known metal-metal soldering technologies, said seam being made of indium or even tin-lead alloy or any solder alloy, especially a low-temperature solder alloy.

To achieve this, a wettable area or surface 5 extending around the periphery of said component 3 is placed on substrate 1. The design of this surface corresponds to the design of the lateral walls that define the package or cover.

This wettable surface can be produced by stacking three layers of titanium/nickel/gold, for example by photolithographic deposition, or by any other stacked arrangement of thin metallic films that are well known in the field of microelectronics.

According to one essential aspect of the invention and as shown in FIG. 4, this wettable area or surface is not uniform but has a certain number of variations in its width consisting of discontinuities.

Thus, in the example described, this wettable area or surface consists of a succession of alternate rectangles of width K*L in the case of the widest rectangles 10 and of width L in the case of the narrower rectangles 11. K is a constant that exceeds 1.1. In addition, said patterns are partially superimposed in order to achieve continuity of the solder or sealing seam.

The actual operation of closing the package or cover on the substrate which occurs after placing the sealing seam on the wettable area thus defined, is performed by increasing the temperature of the chamber in which the substrate and the package in question are located to a temperature in excess of the melting temperature of the alloy or metal that constitutes said seam. A regular, homogeneous seam forms over the length of the wettable area or surface, i.e. around the entire periphery of the package.

The solder or sealing seam can be placed on the wettable surface by using any of the known methods: evaporation, screen printing, electrolysis.

According to one alternative, however, the solder seam may be deposited on the wettable surface by using a technology referred to as metallic printing. This technology makes it possible to achieve considerable reductions in the costs associated with depositing the solder by eliminating, in particular, any photomasking (photolithography) stage while making it possible to use all solid solder deposition techniques.

The operation to mold said solder seam can be performed either by indexing or by a global molding technique, both these techniques being described in the patent application filed on the same day as this application.

Figure 8A:
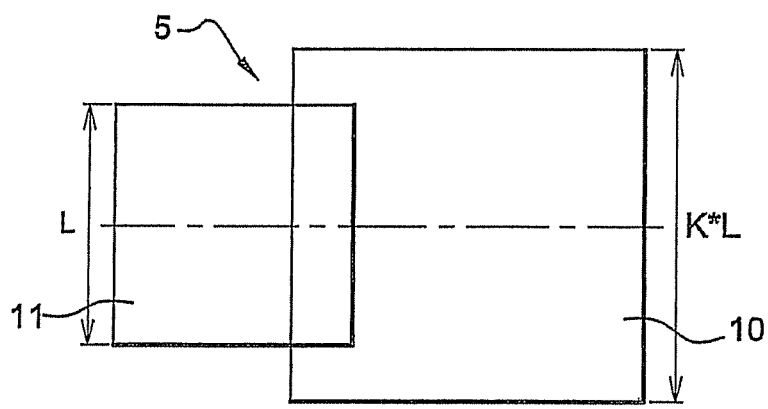
FIGS. 8a, 8b, 8c and 8d are four schematic views of alternative versions of the patterns of the wettable surface in accordance with the invention.
Figure 8B:
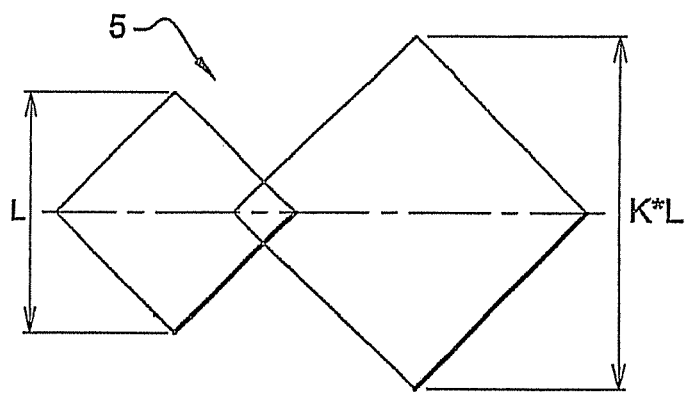

According to one variation of the invention, the wettable surface does not consist of a succession of rectangles but of a succession partially overlapping rhombi or squares as shown schematically in FIG. 8b. One of the diagonals of these patterns is oriented in the direction of the main dimension of the solder seam.

In this configuration, if the value of the other diagonal is L for squares or rhombi 11 equivalent to constricted areas, this same diagonal then has a value of at least K*L for squares or rhombi 10 of large dimensions, the constant K being at least greater than 1.1.

Figure 8C:
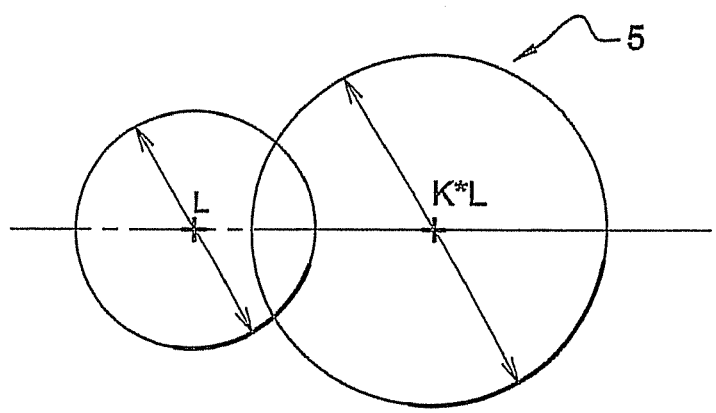

In one alternative version of the invention as shown in FIG. 8c, the wettable surface consists of a succession of partially overlapping discs having a diameter that varies between successive discs from value L to a value at least equal to K*L, constant K being greater than 1.1.

Figure 8D:
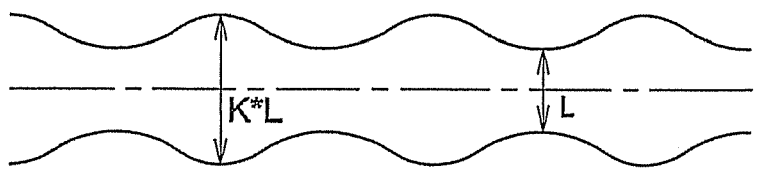

In another version of the invention shown in FIG. 8d, the width of the wettable surface varies continuously rather than discreetly between two extreme values, L and K*L respectively.

In every case and as already indicated, constant K is always greater than the value 1.1. In fact, if constant K is less than this value, surface tension phenomena reappear with consequent risk of a discontinuity in the solder seam during remelting.

Practical experience demonstrates that excellent results are obtained in every case, in accordance with the predictions, where K has a value from 1.6 to 2.

The technology according to the invention makes it possible to use collective cover fitting, i.e. using a single cover on top of several components, especially active components.

This technology is described extensively in document FR 2,780,200 mentioned above. Briefly, this method of fitting covers collectively involves:

simultaneously placing all the covers on the sites to be covered and hence on the various active components;

transporting the sheet on which the covers are positioned into a chamber where the covers will be fitted, if applicable, heating said chamber to a temperature that is less than the melting temperature of the solder seam for the necessary duration required to activate any getters or perform degassing;

feeding the gas or gases intended to be confined in cavity 9 into the chamber or producing the vacuum inside the chamber in question, especially in the case of bolometers and certain MEMS sensors;

and increasing the temperature above the melting temperature of the metal or alloy that constitutes the solder seam so that all the covers drop downwards because of the design of the solder elements used, thus creating a plurality of cavities simultaneously.

Figure 9A:
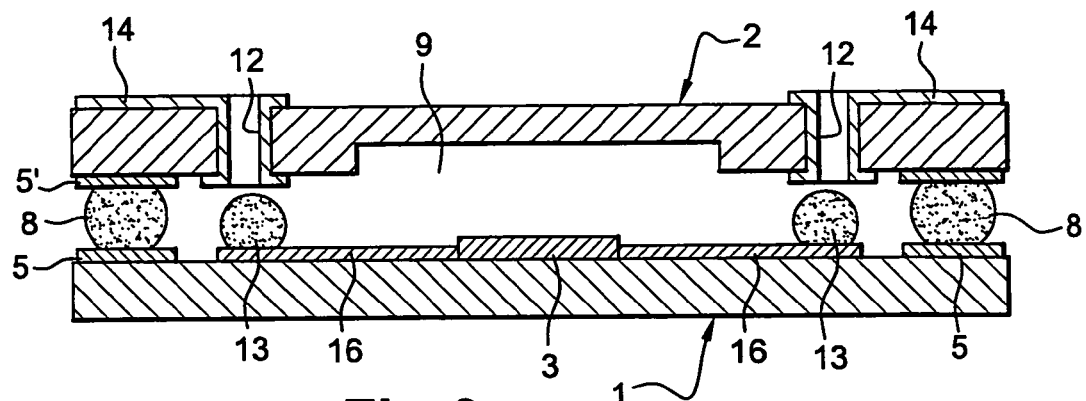
FIGS. 9a and 9b are schematic cross-sectional views of a particular application of the invention for producing a MEMS or an optical component.
Figure 9B:
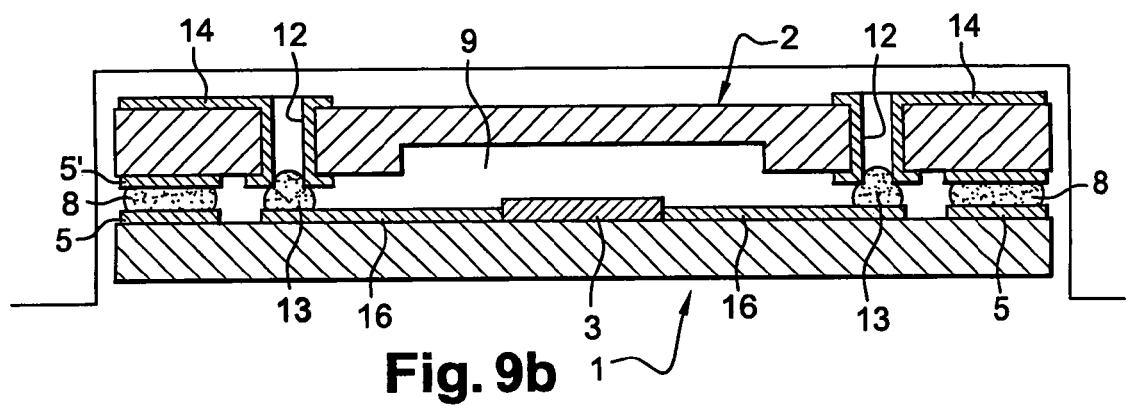

This technology can thus be employed usefully to obtain optical or MEMS devices with densely packed connections, on the surface of the package as well (see FIGS. 9a and 9b).

As is apparent, said package 2 comprises through openings 12 made vertically above conductive bumps or microbumps 13 which themselves rest on conductors 16 which are on the upper surface 4 of the substrate and are connected to the active component 3.

The inner surface of these through openings 12 is metallized, this metallization protrudes slightly on the internal surface of the package or cover 2 so as to optimize electrical contact with the bump or microbump 13 underneath it, thereby incidentally ensuring improved electrical conduction. Reference 14 denotes the conductors on the upper surface of the cover or package 2 that are electrically continuous with the through plating 12 thus produced.

The method according to the invention also makes it possible to promote self-alignment of the cover or package 2 above the active component(s) 3.

Figure 10:
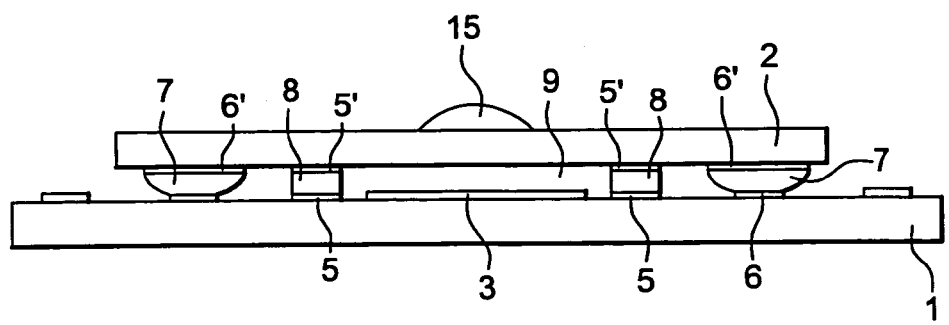
FIG. 10 is a schematic cross-sectional view of an application of the invention with simultaneous self-alignment of the cover and cover fitting.

FIG. 10 is a diagram intended to illustrate such self-alignment. The optical device(s) 15 is/are aligned with wettable surfaces 6' which will align themselves automatically during assembly with wettable surfaces 6. Because surfaces 6 are themselves aligned with component 3, ultimately components 15 and 3 will be in perfect alignment.

Because of the surface tension phenomena mentioned earlier, this difference in positioning or out of plumbness of the respective wettable surfaces generates stresses that promote such self-alignment. In addition, these phenomena also allow a certain amount of tolerance in terms of the positioning of the respective wettable surfaces.

This being so, the possibility of achieving such self-alignment makes it easier to integrate devices that perform an optical function inside the cover or package, for example a device to focus the radiation to be detected by component 3.

The considerable attractiveness of the method according to the invention is therefore readily apparent, especially in terms of the time saved when encapsulating active components and, consequently, improved competitiveness because fabrication costs are reduced significantly.

The invention claimed is:

1. A method for encapsulating a component, especially an electric or electronic component, comprising:
    firstly using a chamber in which there is a vacuum or controlled atmosphere;
    then positioning a continuous sealing seam made of a metal or a metal alloy that advantageously has a low melting temperature on a wettable surface previously placed on a substrate comprising at least one component and extending around the periphery of the component,
    positioning a package or cover of appropriate dimensions on the sealing seam;
    and finally raising the temperature inside said chamber in order to achieve fusion of the material that constitutes the sealing seam, thereby causing firstly the cover or package to drop onto the substrate and consequently and secondly leaktight, hermetic sealing of the cover or package on said substrate capable of providing leaktight isolation of an internal cavity thus defined from the external atmosphere;
    wherein the wettable surface placed on the substrate around the periphery of the component and on which the sealing seam is positioned has intervals of constrictions in one direction of a plane parallel to an upper surface of the substrate other than in the direction parallel to the main direction in which the sealing seam extends.

2. A method for encapsulating a component as claimed in claim 1, wherein the intervals of constrictions of the wettable surface are made in the direction that is at right angles to the main direction in which the sealing seam extends.

3. A method for encapsulating a component as claimed in claim 1, wherein the intervals of constrictions of the wettable surface are periodic.

4. A method for encapsulating a component as claimed in claim 3, wherein the wettable surface consists of a succession of repetitive patterns having the same dimensions.

5. A method for encapsulating a component as claimed in claim 1, wherein the wettable surface consists of a succession of rectangles with the width of two consecutive rectangles varying discretely between two predetermined values.

6. A method for encapsulating a component as claimed in claim 1, wherein the wettable surface consists of a succession of discs with the diameter of two consecutive discs varying discretely between two predetermined values.

7. A method for encapsulating a component as claimed in claim 1, wherein the wettable surface consists of a succession of squares or rhombi, one of the diagonals of which is oriented in the direction in which the sealing seam extends, the other diagonal of two consecutive squares or rhombi varying discretely between two predetermined values.

8. A method for encapsulating a component as claimed in claim 1, wherein L denotes the width of the constriction, and the value of the maximum width of the main pattern is at least K*L, where K is a constant that exceeds 1.1.

* * * * *